United States Patent [19]

Jokura

[11] Patent Number: 5,764,711
[45] Date of Patent: Jun. 9, 1998

[54] PHASE-LOCKED LOOP FREQUENCY SYNTHESIZER

[75] Inventor: Jun Jokura, Tokyo, Japan

[73] Assignee: NEC Corporation, Tokyo, Japan

[21] Appl. No.: 689,050

[22] Filed: Jul. 30, 1996

[30] Foreign Application Priority Data

Jul. 31, 1995 [JP] Japan .................. 7-214089

[51] Int. Cl.[6] .................................. H03D 3/24
[52] U.S. Cl. .................. 375/376; 331/18; 331/25
[58] Field of Search .................. 375/373, 376; 331/14, 18, 25

[56] References Cited

U.S. PATENT DOCUMENTS

| | | | |
|---|---|---|---|
| 4,609,881 | 9/1986 | Wells | 331/1 |
| 4,748,644 | 5/1988 | Silver et al. | 375/120 |
| 4,931,748 | 6/1990 | McDermott et al. | 331/1 |
| 5,146,186 | 9/1992 | Vella | 331/16 |
| 5,521,948 | 5/1996 | Takeuchi | 375/376 |
| 5,546,434 | 8/1996 | Kalafatis | 375/376 |
| 5,553,104 | 9/1996 | Takashi et al. | 375/373 |
| 5,555,276 | 9/1996 | Koenck et al. | 375/303 |
| 5,574,756 | 11/1996 | Jeong | 375/376 |
| 5,581,214 | 12/1996 | Iga | 331/16 |
| 5,604,773 | 2/1997 | Urala | 375/372 |
| 5,604,774 | 2/1997 | Kokugo et al. | 375/376 |
| 5,610,955 | 3/1997 | Bland | 375/376 |

OTHER PUBLICATIONS

H. Adachi et al., "High Speed Frequency Switching Synthesizer Using Fractional N Phase Locked Loop", *J. of the Inst. of Elec., Info. and Comm. Eng.*, vol. J76–C–1, No. 11, Nov. 1993, pp. 445–447.

*Primary Examiner*—Stephen Chin
*Assistant Examiner*—Mohammad Ghayour
*Attorney, Agent, or Firm*—Sughrue, Mion, Zinn, Macpeak & Seas, PLLC

[57] ABSTRACT

A phase-locked loop (PLL) frequency synthesizer is described that both reduces frequency channel spacing and accelerates convergence, and moreover, suppresses the occurrence of spurious noise. A frequency dividing circuit of the PLL frequency synthesizer is composed of a plurality of frequency dividers. By means of a timing generation circuit that is operated by frequency signals from an external oscillation circuit, each of frequency dividers are sequentially delayed by each cycle, and the output of these frequency dividers is taken as feedback signals of the phase comparator of the phase-locked loop.

6 Claims, 4 Drawing Sheets

PHASE-LOCKED LOOP FREQUENCY SYNTHESIZER

BACKGROUND OF THE INVENTION

1. Field of the Invention:

The present invention relates to a frequency synthesizer using a phase-locked loop (PLL), and particularly to a PLL frequency synthesizer having reduced frequency channel spacing and which can realize high-speed convergence.

2. Description of the Prior Art:

Generally, reducing the frequency channel spacing of a PLL frequency synthesizer necessitates increasing the frequency division ratio of the phase-locked loop. However, increasing the frequency division ratio of a phase-locked loop both reduces the reference frequency of the phase-locked loop to a low level and complicates high-speed convergence. Various proposals have been offered for achieving accelerated convergence. For example, in the Journal of the Institute of Electronics, Infomation and Communication Engineers (Adachi Hisashi. November 1993, Vol. J76-C-1, No. 11, pp. 445–447), a high-speed frequency switching synthesizer is described which employs a dispersive frequency dividing method exhibiting excellent high-speed frequency switching and low phase noise characteristics.

FIG. 1 is a block diagram showing a frequency synthesizer according to the dispersive frequency dividing method described in this reference. In this frequency synthesizer, a phase-locked loop is composed of external oscillation circuit 1, phase comparator 2, charge pump 3, loop filter 4, voltage-controlled oscillator (VCO) 5, and variable frequency divider 16; and is provided with an accumulator 17 which varies the frequency division ratio of variable frequency divider 16 based on the output of external oscillation circuit 1. This accumulator 17 is composed of adder 18, latch 19, and controller 20.

In accumulator 17 of this frequency synthesizer, a setting signal of frequency division ratio M is outputted from controller 20 to variable frequency divider 16, and a value k is outputted from controller 20 to adder 18. A clock from external oscillation circuit 1, which is the reference frequency, is latched at latch 19 and sequentially inputted to adder 18, whereby the value of k from controller 20 is calculated, and for each of these calculations, an overflow signal is outputted from adder 18. By means of these overflow signals outputted from adder 18, the frequency division ratio of variable frequency divider 16 is made M+1. When an overflow signal is not generated, frequency division ratio M is maintained at variable frequency divider 16.

Accordingly, referring to FIG. 2, if (one cycle of the standard signal)/$f_r$ is one clock, and the frequency division ratio is varied once from M to M+1 in the interval of L clocks in the interval of time T, the average value of the frequency division ratio in time T is given by (M+1)/L. Here, because 1/L can be considered as expanded to k/L, by making k=0, 1, 2, . . . , the frequency division ratio can be set in steps of 1/L.

If the sensitivity of phase comparator 2 is KPD, the sensitivity of VCO5 is $K_v$, the output frequency is $f_{out}$ and the reference frequency is $f_r$, the loop gain $K_o$ is given by the following equation:

$$K_o = K_v \cdot DPD/N = K_v \cdot KPD/(f_{out}/f_r)$$

From this equation, it can be seen that when the frequency division ratio is low and the reference frequency $f_r$ is high, loop gain Ko is large and the convergence time is reduced.

However, in a PLL frequency synthesizer of the above-described dispersive frequency division method, the frequency division ratio changes with time T taken as the basic cycle, and consequently, the frequency component of 1/T and its integral power are represented as components of the output of the phase comparator. As a result, modulation occurs in the output signal of the VCO, and the problem arises that high-level spurious noise based on frequency 1/T occurs in the vicinity of the central frequency of the VCO output signal.

SUMMARY OF THE INVENTION

The object of the present invention is to provide a PLL frequency synthesizer that both reduces frequency channel spacing and accelerates convergence, and moreover, which suppresses the occurrence of spurious modulation.

To achieve the above-described objects, a PLL frequency synthesizer according to the present invention is configured such that, in a PLL frequency synthesizer provided with a voltage-controlled oscillator, a frequency divider circuit that frequency divides the frequency signals outputted by the voltage-controlled oscillator, a phase comparator that compares the phases of these frequency-divided signals and external oscillation frequency signals, and means for generating a control voltage of the voltage-controlled oscillator based on the resulting phase difference signals; the frequency divider circuit is made up of a plurality of frequency dividers having equal frequency divided ratios, and moreover, which output frequency division signals having time differentials of one cycle of the external oscillation frequency signal, and the output of these frequency dividers is inputted to the phase comparator as feedback signals.

The plurality of frequency dividers making up the frequency divider circuit are preferably constructed so as to output frequency divided signals when enable signals are inputted, and are provided with timing generation circuits that input to each frequency divider respective enable signals at time differentials of one cycle of the external oscillation frequency signals. In addition, this timing generation circuit is preferably constructed such that flip-flops equal in number to the frequency dividers are in cascade connection and operate by taking the external frequency signals as clock signals and outputting enable signals when control signals are inputted, a control signal inputted to the leading flip-flop being sequentially inputted to the next-stage flip-flop.

According to the present invention constructed according to the foregoing description, the frequency divider circuit of the PLL frequency synthesizer is composed of a plurality of frequency dividers, the outputs of these frequency dividers are sequentially delayed and outputted for each cycle of the external oscillation frequency signals, which are taken as the standard signals of the phase-locked loop and taken as feedback signals by the phase comparator, thereby enabling phase comparison at a high reference frequency and at high-speed convergence even when channel spacing is reduced. Moreover, because the frequency division ratio is fixed and unchanging within one cycle, there is no danger of modulation of the VCO output and spurious noise does not occur as in the prior art.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

An embodiment of the present invention will next be explained with reference to the accompanying figures.

Figure 1:
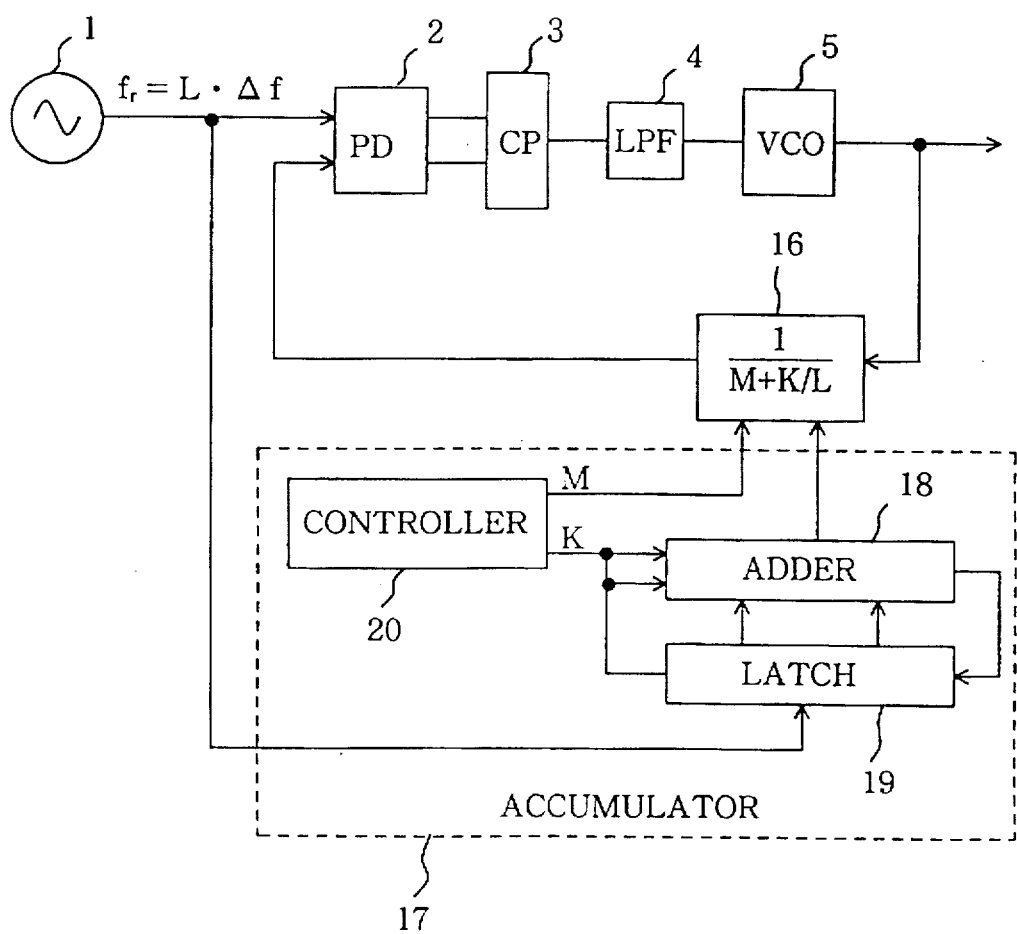
FIG. 1 is a block circuit diagram of one example of a prior-art frequency synthesizer of the dispersive frequency division type.
Figure 2:
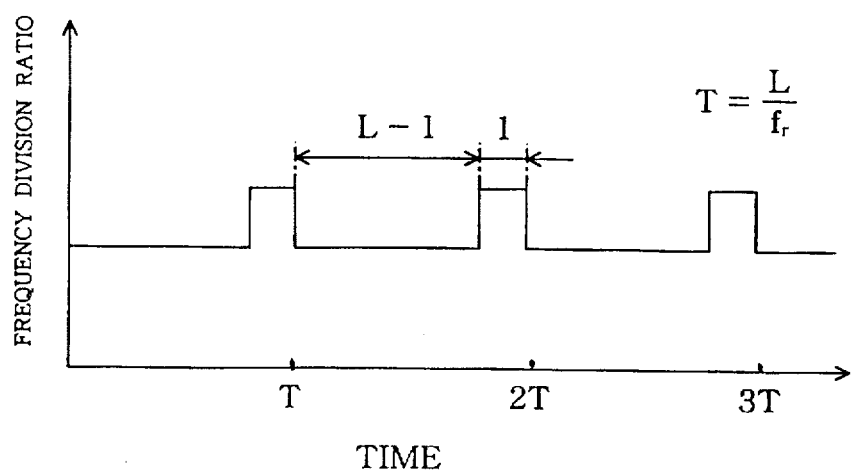
FIG. 2 is a waveform chart illustrating the operation of the circuit of FIG. 1.
Figure 3:
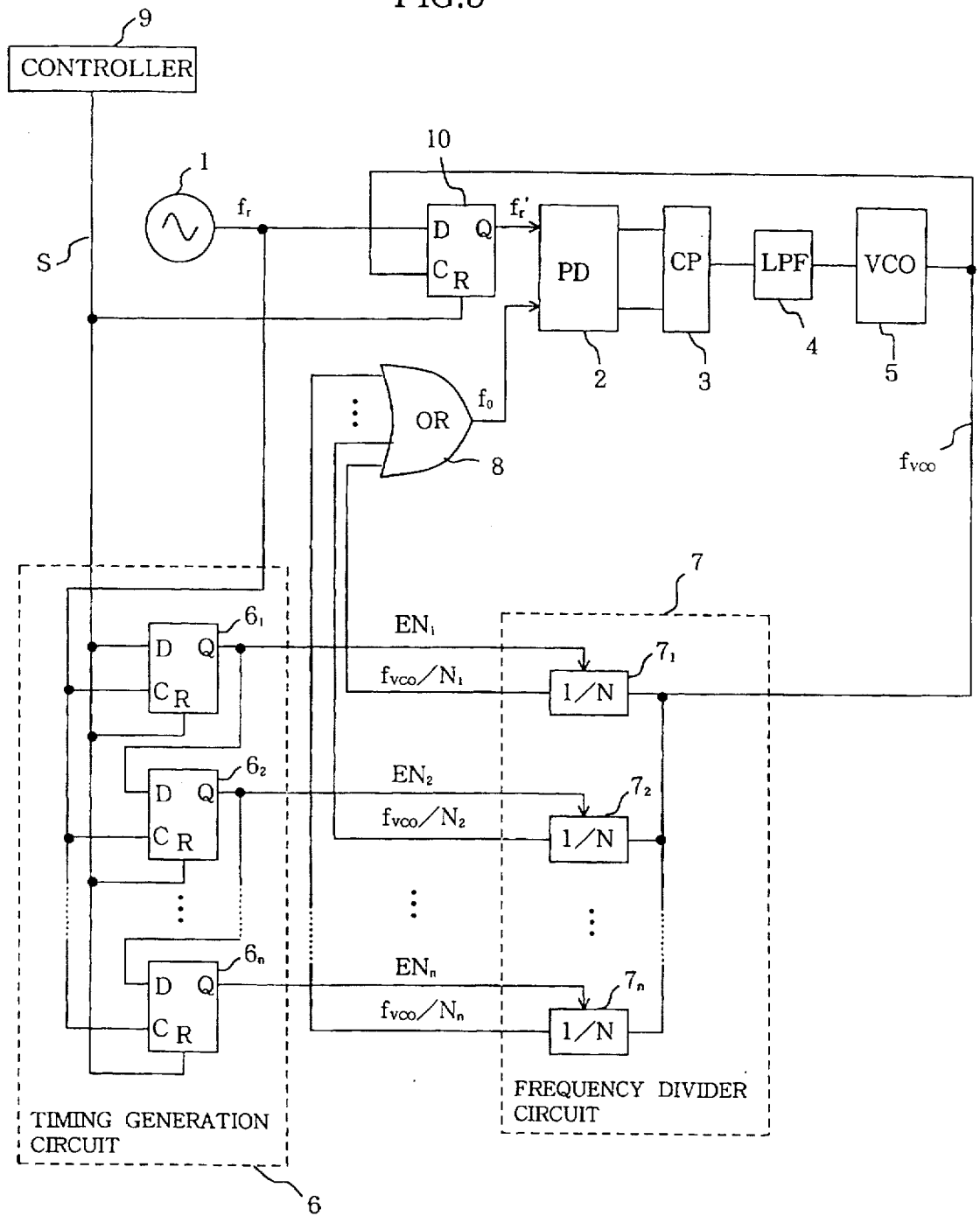
FIG. 3 is a block circuit diagram showing one embodiment of a PLL frequency synthesizer according to the present invention.

FIG. 3 is a block circuit diagram showing one embodiment of the present invention. In this figure, external oscillation circuit 1, which outputs a reference frequency $f_r$; phase comparator 2; charge pump 3; loop filter 4; and VCO 5 are equivalent to the previously described prior-art construction.

The external oscillation frequency signal $f_r$ of external oscillation circuit 1 is inputted to phase comparator 2 by way of reference signal flip-flop (FF) 10, and one portion of the output of VCO 5 is inputted as the clock of reference signal FF 10. The output of VCO 5 is inputted to frequency divider circuit 7 which is made up of n (n being an integer equal to or greater than 2) frequency dividers $7_1$-$7_n$, the output of each of frequency dividers $7_1$-$7_n$ is inputted to OR gate 8, and by way of this OR gate 8, inputted to the above-described phase comparator 2.

The above-described frequency dividers $7_1$-$7_n$ are synchronous frequency dividers that frequency-divide the oscillation output $f_{VCO}$ of VCO 5 to a channel spacing of $\Delta f$ of the output frequency, and are each respectively enabled by enable signal output $EN_1$-$EN_n$ of timing generation circuit 6. Timing generation circuit 6 is constructed from the same number n of flip-flops $6_1$-$6_n$ as the frequency dividers, and is controlled by control circuit 9. In other words, each of FF $6_1$-$6_n$ take operation signal S generated at the time of channel switching operation in control circuit 9 as reset input, and take external oscillation frequency signal $f_r$ as clock input. In addition, the first FF $6_1$ takes operation signal S as D input, and the next-stage and succeeding flip-flops $6_2$-$6_n$ take the output of the previous-stage flip-flop as D input. Accordingly, by means of this flip-flop cascade connection, each of FF $6_1$-$6_n$ sends an enable signal $EN_1$-$EN_n$ to the corresponding frequency divider $7_1$-$7_n$ n at timings shifted for each cycle in response to rises in the external oscillation frequency signal $f_r$.

Each of frequency dividers $7_1$-$7_n$ outputs a respective N-frequency-divided signal $f_{VCO}/N1$-$f_{VCO}/Nn$ of oscillation output $f_{VCO}$ when the respective enable signal $EN_1$-$EN_n$ rises. Because each enable signal $EN_1$-$EN_n$ is outputted at a timing shifted according to external oscillation frequency signal $f_r$ as described hereinabove, the first pulse in each frequency divider is respectively delayed by approximately $1/f_r$. The shift from $1/f_r$ is $1/f_{VCO}$ at maximum. Logical multiplication of this frequency divider output is effected at OR gate 8 and inputted to phase comparator 2 as feedback signal $f_o$.

By means of the above-described construction, the outputs of n frequency dividers $7_1$-$7_n$, which are sequentially enabled at delays for each cycle of external oscillation frequency signal $f_r$, which is taken as the reference signal of the phase-locked loop, are logically multiplied at OR gate 8, these signals are frequency divided to $\Delta f$, which is the channel spacing in each frequency divider, and the resulting signals are N-stage superposed and taken as feedback signals. As a result, phase comparison is performed at a high reference frequency of n×$\Delta f$, thereby enabling high-speed convergence even at reduced channel spacing. In addition, because the frequency division ratio according to this configuration is fixed and undergoes no variation over one cycle, the danger of modulation of the VCO output is obviated and spurious noise does not occur.

Figure 4:
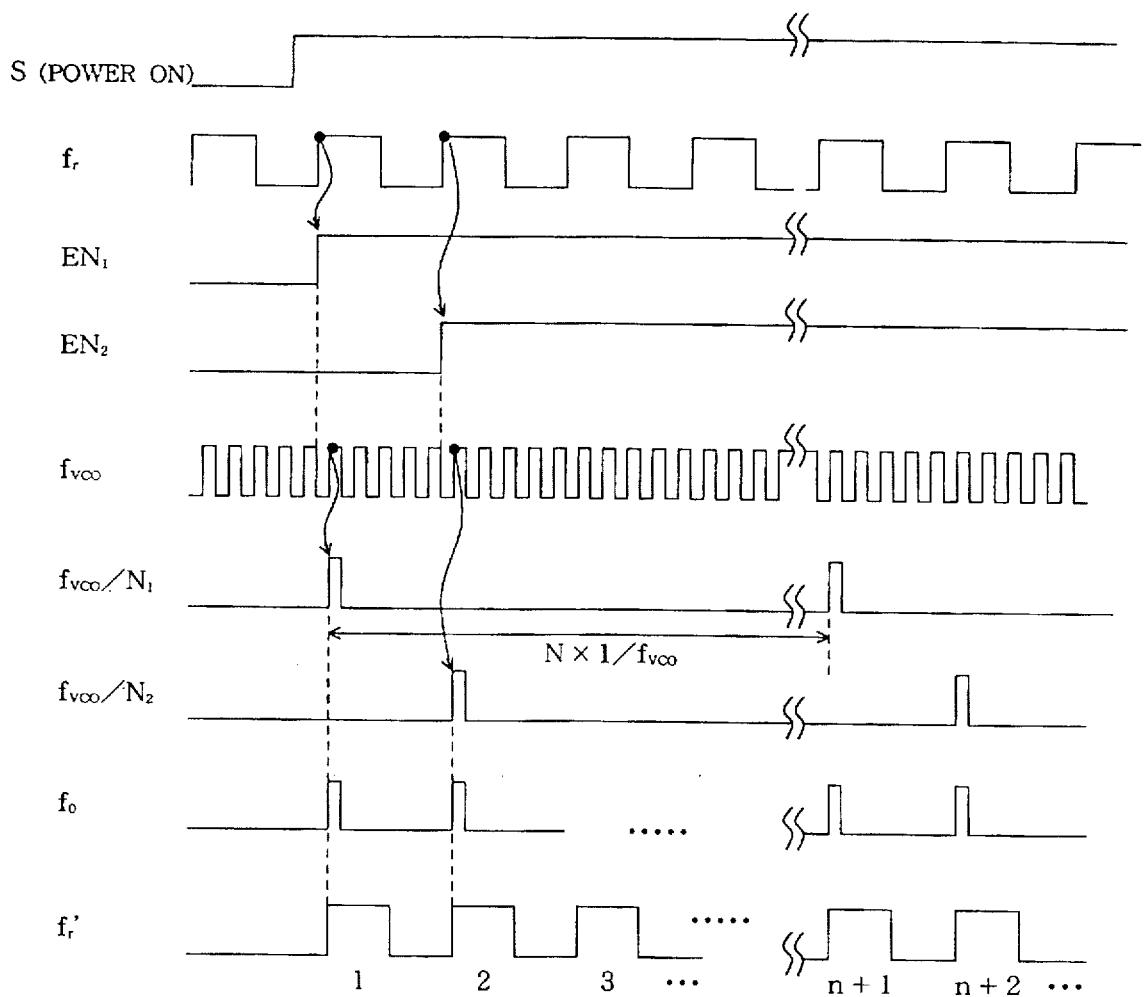
FIG. 4 is a waveform chart showing an example of the operation of the circuit of FIG. 3.

An example of the operation of the PLL frequency synthesizer of this embodiment will next be explained with reference to FIG. 4. In the following explanation, synchronism will be considered with channel spacing at 200 KHz and oscillation frequency at 999.8 MHz. Here, the number n of frequency dividers in frequency divider circuit 7 is 5, and $f_r$ is 1 MHz. Furthermore, N=4999, and $f_{VCO}/N=200$ KHz.

If it is assumed that the rise phase of $f_r$ matches that of the $f_{VCO}/N1$ signal, the $f_{VCO}/N2$ signal rises at the 1000th cycle of $f_{VCO}$ with respect to $F_{VCO}/N1$, and $f_{VCO}/N3$-$f_{VCO}/N5$ each rise at the 1000th cycle of $f_{VCO}$ with respect to $f_{VCO}/N$ of the preceding stage. The second pulse of $f_{VCO}/N1$ rises at the 999th cycle of $f_{VCO}$ from the first pulse of $f_{VCO}/N5$. This is because the spacing is entirely 1000 cycles at oscillation frequency 999.8 MHz$\leq f_{out} < 1000.2$ MHz, and the spacing between $f_{VCO}/N4$ and $f_{VCO}/N5$ is 999 cycles at 999.75 MHz$\leq f_{out} < 999.8$ MHz.

On the other hand, based on FF 10 that takes oscillation output $f_{VCO}$ as clock input, the $f_r$ signal, which matches external oscillation frequency signal $f_r$ to the rise phase of $f_{VCO}$, is inputted to phase comparator 2 as the reference signal.

As for the signals of $f_{VCO}/N1$ to $f_{VCO}/N5$, the rise of $f_r$ from the first pulse to the fifth pulse coincides with the rise of $f_{VCO}/N1$ to $f_{VCO}/N5$. Accordingly, by outputting phase comparison signals after a phase shift at the sixth pulse of $f_r$, i.e., the second pulse of $f_{VCO}/N1$, phase comparison output is generated every other 1000 or 999 cycles of $f_{VCO}$ if the oscillation frequency is 999.6 MHz$<f_{out}<1000$ MHz, i.e., 999.8 MHz ±200 Hz. In this case, the reference frequency of phase comparison is between $f_{VCO}/1000$ and $f_{VCO}/999$, which equals $f_r$.

In switching synchronism in the case of large frequency spacing, when there are similarly n frequency dividers, phase comparison signals are outputted at reference signal $f_r'$ pulses following n+1, and when within the range of synchronous frequency±channel spacing as described above, the spacing from $f_{VCO}/N1$ to $f_{VCO}/Nn$ is $1/f_{VCO} \times N/n$ (N/n being an integer, however), and though not always of equal spacing, the maximum spacing difference is $1/f_{VCO}$. Here, $f_r$=synchronous frequency×n/N. However, through phase comparison with $f_r'$ signals by initial phasing with $f_{VCO}$, the $f_r'$ reference signal is similarly an unequally spaced signal having a rise phase matched to $f_{VCO}$, even at values at which frequency division ratio N is not divisible by the number of frequency dividers, $f_{VCO}/N1$ to $f_{VCO}/Nn$ do not have equal spacing, and only $1/f_{VCO}$ is shifted. In synchronous convergence, the rise of each corresponding pulse coincides, and phase comparison signals are therefore not outputted. For the reference frequency of phase comparison in such a PLL frequency synthesizer, $f_r'$ can be considered equal to $f_r$.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A phase-locked loop (PLL) frequency synthesizer comprising a voltage-controlled oscillator, a frequency divider circuit that frequency divides the frequency signals outputted by said voltage-controlled oscillator, a phase comparator that compares phases of said frequency-divided signals and external oscillation frequency signals, and means for generating a control voltage of said voltage-controlled oscillator based on the resulting phase difference signals;

wherein said frequency divider circuit is made up of a plurality of frequency dividers having equal frequency division ratio, and moreover, which output frequency divided signals having time differentials of one cycle of said external oscillation frequency signal, and the outputs of these frequency dividers is inputted to said phase comparator as feedback signals.

2. A PLL frequency synthesizer according to claim 1 wherein said plurality of frequency dividers are constructed so as to output frequency divided signals when enable signals are inputted, and are provided with timing generation circuits that input to each frequency divider respective enable signals at time differentials of one cycle of external oscillation frequency signals.

3. A PLL frequency synthesizer according to claim 2 wherein said timing generation circuit is preferably constructed such that flip-flops equal in number to said frequency dividers are in cascade connection and operate by taking said external oscillation frequency signals as clock signals and outputting enable signals when control signals are inputted, a control signal inputted to the leading flip-flop being sequentially inputted to the next-stage flip-flop.

4. A PLL frequency synthesizer according to any of claims 1 to 3 wherein outputs of said plurality of frequency dividers are each inputted to respective OR gates, and outputs of said OR gates are inputted to said phase comparator as feedback signals.

5. A PLL frequency synthesizer according to any of claims 2 or 3 wherein said external oscillation frequency signals pass through flip-flops which take output of said voltage-controlled oscillator as a clock signal and are inputted to said phase comparator.

6. A PLL frequency synthesizer according to claim 4 wherein said external oscillation frequency signals pass through flip-flops which take output of said voltage-controlled oscillator as a clock signal and are inputted to said phase comparator.

* * * * *